US 6,563,391 B1

(12) United States Patent
Mar

(10) Patent No.: US 6,563,391 B1
(45) Date of Patent: May 13, 2003

(54) PRECISION CRYSTAL OSCILLATOR CIRCUIT USED IN MICROCONTROLLER

(75) Inventor: Monte Mar, Issaquah, WA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 09/842,966

(22) Filed: Apr. 25, 2001

Related U.S. Application Data

(60) Provisional application No. 60/243,708, filed on Oct. 26, 2000.

(51) Int. Cl.[7] .............................. H03B 5/36; H03B 5/32
(52) U.S. Cl. ............................. 331/116 R; 331/116 FE; 331/158; 331/173; 331/179
(58) Field of Search ........................... 331/1 A, 34, 57, 331/116 R, 116 FE, 117 R, 117 FE, 158, 173, 177 R, 179

(56) References Cited

U.S. PATENT DOCUMENTS 5,142,249 A * 8/1992 Hirotomi ..................... 331/57
6,025,757 A * 2/2000 Tsukagoshi ................. 331/158
6,072,372 A * 6/2000 Yokoyama .................... 331/57
6,157,265 A * 12/2000 Hanjani ......................... 331/49

* cited by examiner

*Primary Examiner*—David C. Mis
(74) *Attorney, Agent, or Firm*—Wagner, Murabito & Hao LLP

(57) ABSTRACT

A microcontroller is disclosed that includes a crystal oscillator circuit that is programmable to provide multiple different levels of startup current. In the present embodiment, the crystal oscillator circuit includes logic devices for receiving programming indicating one of a plurality of different startup current levels and a resistor chain. The logic devices are coupled to the resistor chain for controlling the resistance of the oscillator circuit such that, upon receiving programming indicating a particular startup current level, the crystal oscillator circuit generates a corresponding startup current. In addition, the crystal oscillator circuit includes provision for selecting one of a plurality of different levels of capacitance. Furthermore, the crystal oscillator circuit includes a pass gate that includes circuitry for assuring predetermined startup conditions are met. A feedback loop that includes an amplifier provides for steady-state operations that have low power consumption.

24 Claims, 6 Drawing Sheets

PRECISION CRYSTAL OSCILLATOR CIRCUIT USED IN MICROCONTROLLER

RELATED U.S. APPLICATION

This Application claims priority to the copending provisional patent application Serial No. 60/243,708, filed Oct. 26, 2000, entitled "ADVANCED PROGRAMMABLE MICROCONTROLLER DEVICE".

BACKGROUND OF THE INVENTION

1. Field of the Invention

The present invention relates to the field of semiconductor devices. More particularly, the present invention relates to a crystal oscillator circuit for a microcontroller.

2. Related Art

Complimentary Metal Oxide Semiconductor (CMOS) microcontroller devices typically include crystal-based oscillators for signal timing. More particularly, CMOS devices typically include a crystal that couples to an oscillator circuit.

It is desirable to obtain an oscillator circuit that has low power consumption. More particularly, it is desirable to obtain oscillator circuits that draw current in the micro amp range or below. However, when the oscillator circuit starts up at a low bias current, the start-up process takes a long time. In addition, if a design were to have an initial low bias current (in the micro amp range or below), it is not clear whether the circuit would start-up. Though a higher current gives a faster start-up, it gives an unacceptably high steady state current draw.

In addition, prior art crystal oscillator circuits are not configurable. Therefore, in order to obtain a different start-up and steady-state conditions an entirely new microcontroller must be designed and manufactured. This is inconvenient and expensive.

What is needed is an oscillator circuit that has low power consumption. More particularly, an oscillator circuit is needed that will draw in the micro amp range or below. In addition, an oscillator circuit is needed that meets the above needs and that will provide sufficient startup current and gain to assure quick initial oscillation of the crystal. In addition, a crystal oscillator circuit is needed that allows for obtaining different start-up and steady-state conditions. The present invention provides a solution to the above needs.

SUMMARY OF THE INVENTION

The present invention provides a programmable oscillator circuit that has low power consumption. The oscillator circuit of the present invention has the capability of drawing in the micro amp range or below. In addition, the oscillator circuit of the present invention provides sufficient startup current to quickly start-up oscillation of the crystal.

A crystal oscillator circuit is described that is programmable to provide multiple different levels of startup current. Each of the different levels of startup current are sufficient to obtain start-up. However, by using a higher level startup current, a faster startup is obtained.

In the present embodiment, the crystal oscillator circuit includes logic devices for receiving programming indicating one of a plurality of different startup current levels. In the present embodiment, the logic devices include a decoder, and flip-flops that are adapted to control the startup current level. In the present embodiment, three PMOS devices couple to the decoder and couple to a resistor chain. The PMOS devices are operable in response to input from the decoder to form a current mirror having different levels of current. Thus, the logic devices operate to control the resistance of the current bias circuit such that, upon receiving programming indicating a particular startup current level, the crystal oscillator circuit generates a corresponding startup current.

The crystal oscillator circuit further includes provision for selecting one of a plurality of different levels of capacitance. In addition, the crystal oscillator circuit includes a pass gate that includes circuitry for shorting a first node to a second node for assuring predetermined startup conditions are met.

In one embodiment, a microcontroller is disclosed that includes at least two contact pads for coupling to an external crystal and a crystal oscillator circuit that includes provision for selecting one of a plurality of different levels of startup current for controlling the startup speed of crystal oscillation. In one embodiment, the microcontroller also includes provision for selecting one of a plurality of different levels of capacitance.

A feedback loop that includes an amplifier provides for steady-state operations that have low power consumption. In one embodiment, the feedback loop generates a post-startup current that is reduced(from the startup current level) such that the circuit draws in the micro amp range or below during steady state operations.

The startup conditions have a small effect on the current draw during steady state operations. More particularly, when a higher levels of startup current is chosen(which gives faster startup time), slightly higher current draw results during steady state operations. Consequently, the lower level of current and gain give slower startup times but result in lower power draw during steady state conditions.

By providing multiple different levels of startup current, programmers can choose a startup condition that meets the needs of the circuit's application. More particularly, the programmer can select a level of startup current that appropriately trades-off startup speed with the effects of start-up speed on the steady state current during steady state operation.

The oscillator circuit of the present invention is programmable to provide multiple different levels of startup current and multiple levels of capacitance. This allows for configuring the startup current and the capacitance according to the needs of the circuit's application. In addition, the oscillator circuit of the present invention has low power consumption. More particularly, the oscillator circuit of the present invention will draw in the micro amp range or below during steady state operations.

In addition, because the microcontroller of the present invention is programmable, there is no need to design and manufacture a new microcontroller to obtain a different start-up or steady-state conditions. In addition, the microcontroller of the present invention is more manufacturable than prior art microcontrollers because there are more settings that can be adjusted to increase yield.

These and other objects and advantages of the present invention will become obvious to those of ordinary skill in the art after having read the following detailed description of the preferred embodiments that are illustrated in the various drawing figures.

DETAILED DESCRIPTION OF THE INVENTION

In the following detailed description of the present invention, numerous specific details are set forth in order to provide a thorough understanding of the present invention. However, it will be recognized by one skilled in the art that the present invention may be practiced without these specific details or with equivalents thereof. In other instances, well known methods, procedures, components, and circuits have not been described in detail as not to unnecessarily obscure aspects of the present invention.

Figure 1:
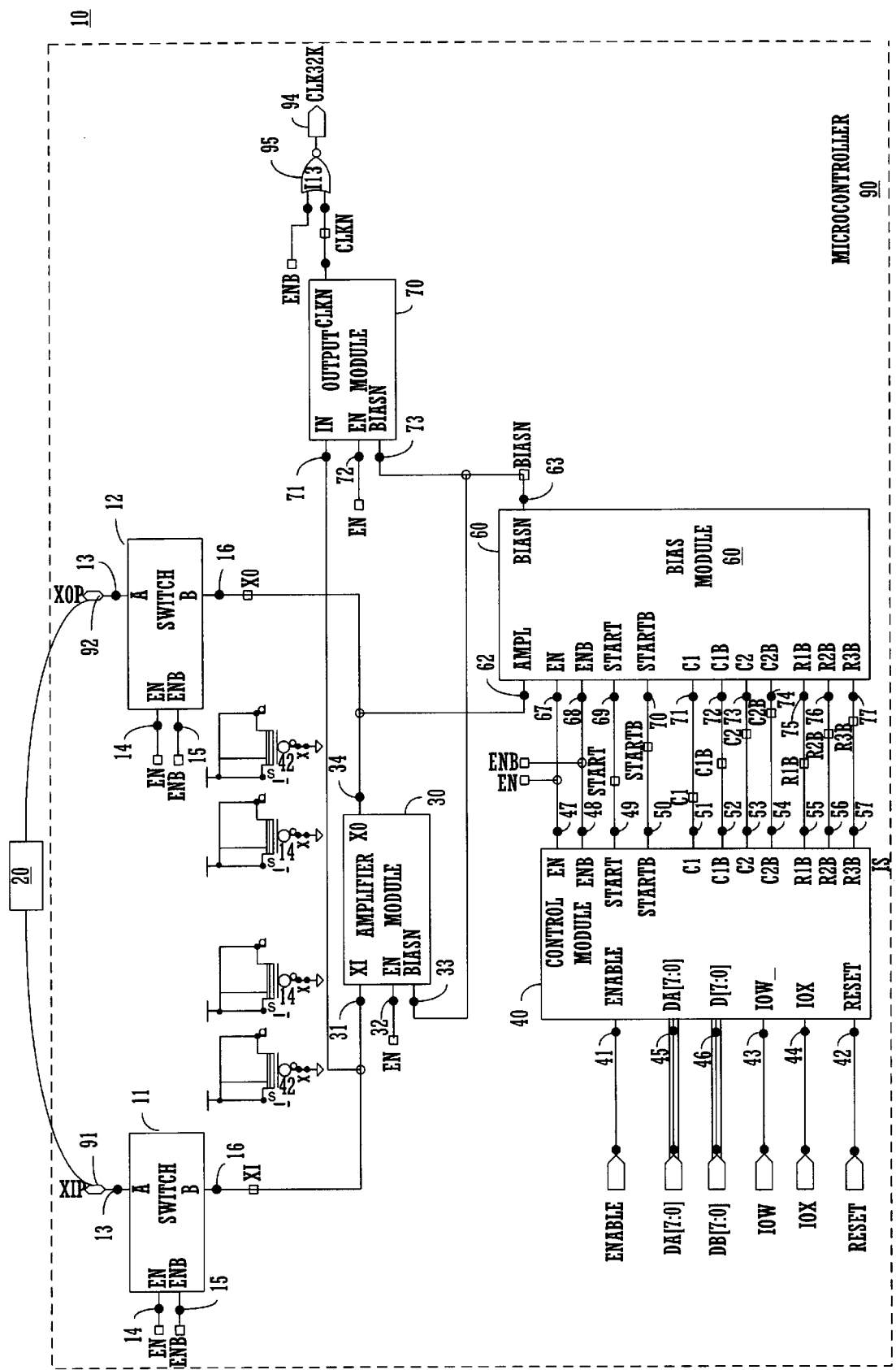
FIG. 1 shows a crystal oscillator circuit that is coupled to a crystal in accordance with one embodiment of the present invention.

Referring now to FIG. 1, circuit 10 is shown that includes microcontroller 90 that is coupled to external crystal 20. In the present embodiment microcontroller 90 includes contact pads, 91–92 for coupling the external crystal 20 to microcontroller 90.

Continuing with FIG. 1, in the present embodiment, microcontroller 90 is a Complimentary Metal Oxide Semiconductor (CMOS) device that is operable, in response to input via busses 45–46 and input nodes 41–44 to generate a clock signal which is output at node 94. However, microcontroller 90 is also well adapted for coupling to other devices and/or circuits for performing various other functions. When microcontroller 90 is not coupled to a crystal (e.g., crystal 20), switches 11–12 are opened. Thereby, contact pads 91–92 are available for coupling to other devices and/or circuits. This allows microcontroller 90 to perform other functions using contact pads 91–92.

Figure 6:
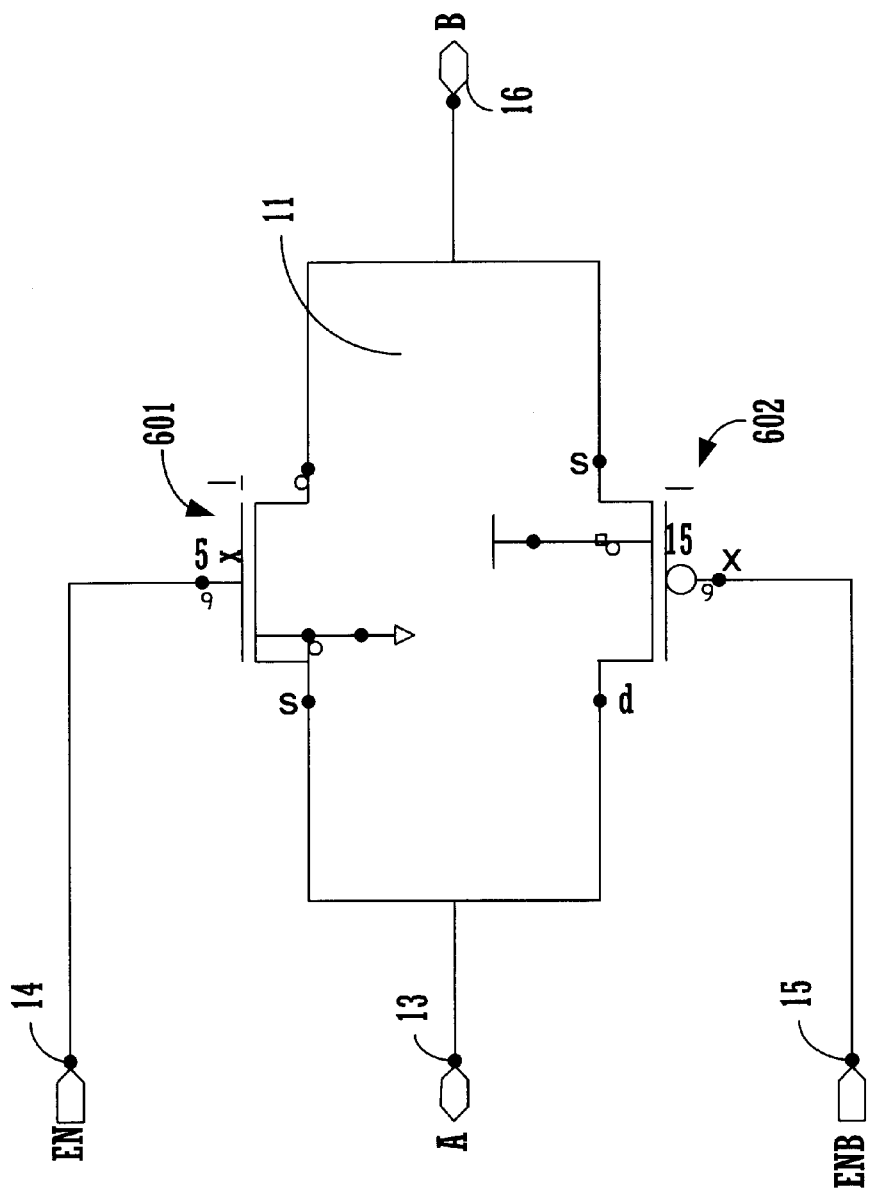
FIG. 6 shows a switch in accordance with one embodiment of the present invention.

Referring now to FIG. 6, additional detail regarding the operation of switch 11 is provided. NMOS device 601 and PMOS device 602 are operable in response to input received at Node 14(EN) and Node 15(ENB) for controlling the operation of switch 11. In the present embodiment, switch 12 is identical to switch 11. However, the present embodiment is well suited to the use of different types of switches.

Continuing with FIG. 1, crystal 20 provides input, via contact pad 91 and switch 11, to amplifier module 30 at input node 31 (XI). In the present embodiment, amplifier module 30 is operable to amplify the signal from crystal 20 using the bias current received at node 33(BIASEN). The amplified signal is output at node 34(XO). The amplified signal is fed back to the crystal 20 via switch 12 and contact pad 92.

Figure 2:
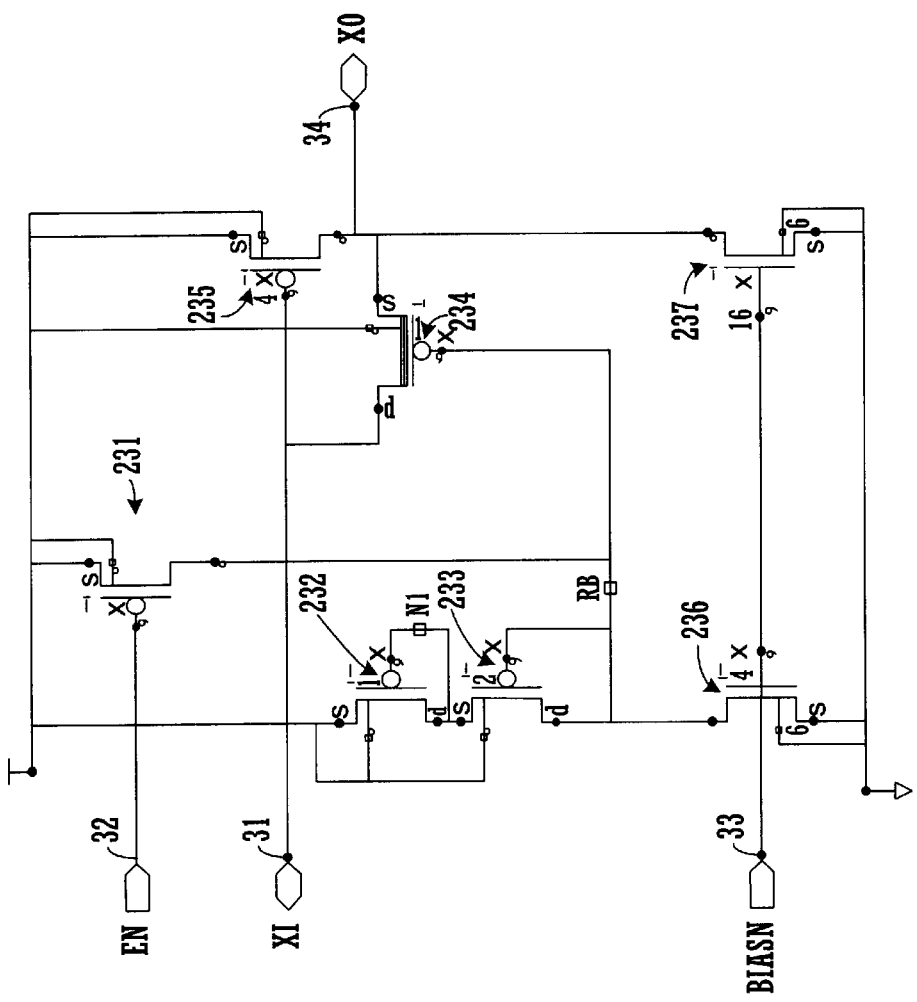
FIG. 2 shows an amplifier module in accordance with one embodiment of the present invention.

In the embodiment shown in FIG. 2, amplifier module 30 is operable upon receiving an enable signal at node 32(EN) for amplifying input received at node 31(XI). More particularly, amplifier module 30 amplifies the received input. using bias current received at node 33(BIASEN), PMOS devices 231–235, and NMOS devices 236–237 to produce output at node 34(XO).

Referring back to FIG. 1, control module 40 is operable to control the operation of circuit 10 in response to input received at nodes 41–44 and busses 45–46. Bias module 60 is operable to generate a plurality of different initial current levels according to the input received from control module 40. The programmed initial current level, referred to herein as the startup current, is controlled by the output at node 63(BIASN) of bias module 60. The control voltage is then coupled to output module 70 and is coupled to amplifier module 30. A feedback loop is obtained as a result of coupling the output from amplifier module node 34 to node 62 of bias module 60.

Figure 4:
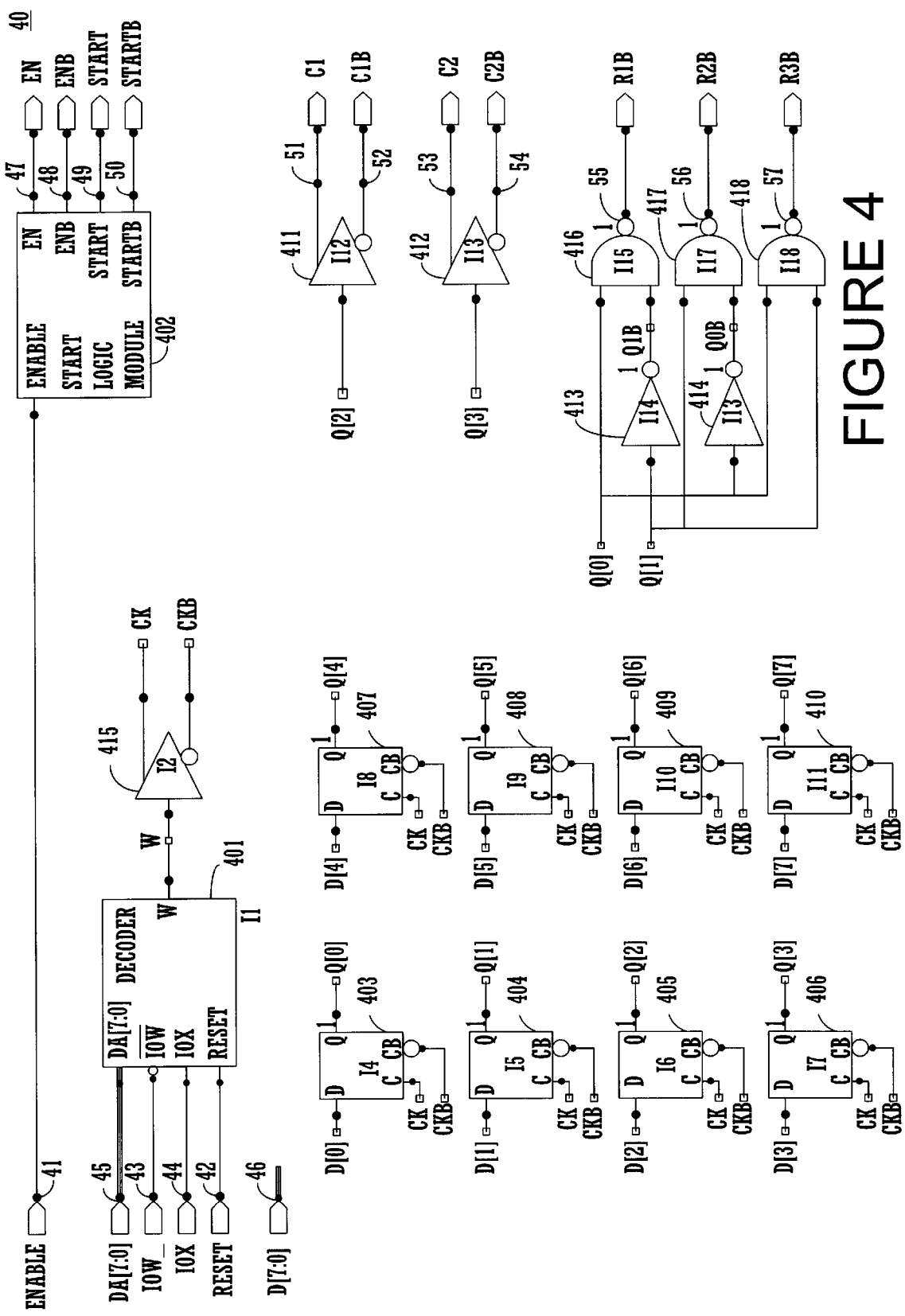
FIG. 4 shows a control module in accordance with one embodiment of the present invention.

In the embodiment shown in FIG. 4, control module 40 is programmable for controlling the startup current. More particularly, the input received at control module 40 indicates which of several startup current levels are to be used. In the present embodiment startup current is controlled by selectively providing output to one of nodes 55–57. More particularly, in the present embodiment, input via busses 45–46, node 42(RESET), node 43(IOW), and node 44(IOX) indicates one of four levels of resistance for providing one of four different levels of startup current.

Still referring to FIG. 4, D-flip flops 403–404 are operable in conjunction with inverters 413–415, and NAND devices 416–418 for decoding the received input so as to generate output that is coupled to nodes 51–54. In the present embodiment, no voltage is provided to any of nodes node 55(R1B), 56(R2B), 57(R3B), for obtaining a first level of resistance, and hence a first level of startup current. In the present embodiment, voltage drives node 55(R1B), for obtaining a second level of resistance, and hence a second level of startup current. Similarly, voltage drives node 56(R2B) for obtaining a third level of resistance, and hence a third level of startup current. Current is coupled to node 57(R3B) for obtaining a fourth level of resistance, and hence a fourth level of startup current. Though control module 40 is shown to be programmable for obtaining four different levels of startup current, the present invention is well adapted for being programmable for obtaining any of a number of levels of startup current.

Figure 3:
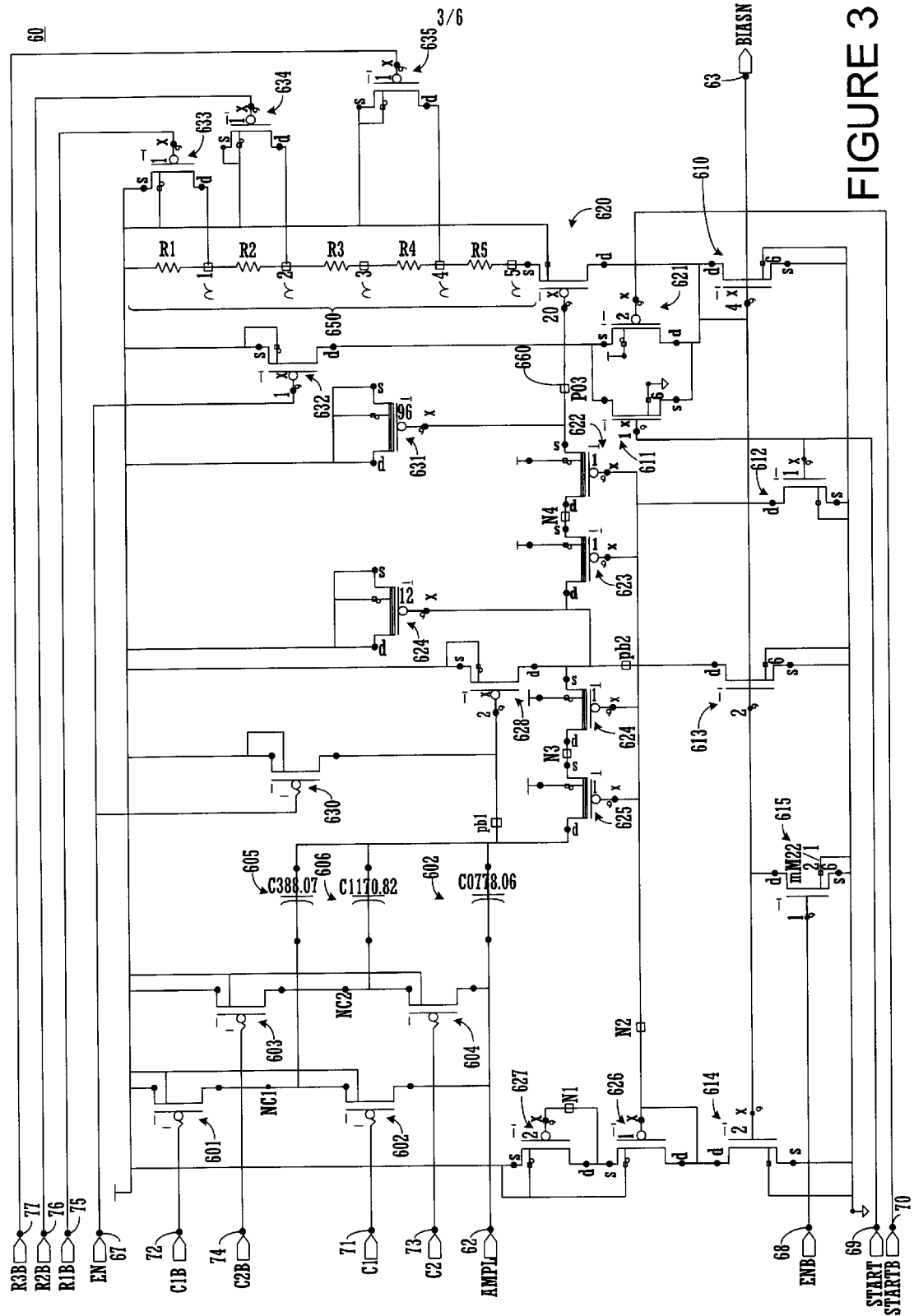
FIG. 3 shows a bias module in accordance with one embodiment of the present invention.

FIG. 3 shows an embodiment of bias module 60 that is operable, upon receiving input from control module 40, to generate multiple different levels of startup current. Bias module 60 is shown to include PMOS devices 601–604 and 620–635, NMOS devices 610–615, capacitors 605–607, and resistor chain 650. Resistor chain 650 includes resistors R1–R5. In the present embodiment, resistor R1 has a resistance of approximately 425 k ohms, R2 has a resistance of approximately 105 k ohms, R3 has a resistance of approximately 106 k ohms, R4 has a resistance of approximately 210 k ohms, and R5 has a resistance of approximately 212 k ohms. However, the present invention is well adapted for the use of fewer or more resistors and for using resistors having different resistance values.

Referring still to FIG. 3, two current mirrors are shown that include resistor chain 650. The first current mirror includes resistor chain 650 and PMOS devices 620 and 628. The second current mirror includes PMOS device 613 and NMOS device 610. This current mirror will self bias up to a first startup current value. In the present embodiment, a voltage of 3.3 volts is supplied to obtain a first startup current value of approximately 2 microamps.

Input received from node 75 is operable to short the gate of PMOS device 633 such that only resistors R2–R5 are included in the current mirror. Thus, the current mirror will self bias up to a second startup current value. In the present embodiment, the current mirror will bias to a current equal to the difference between the gate source voltages of PMOS device 628 and PMOS device 620 divided by the resistance of the resistor chain produced by resistors R2–R5 to produce a second startup current value.

When input is received at node 76, the gate of PMOS device 634 is shorted such that resistors R3–R5 are included in the current mirror. Thus, the current mirror will self bias up to a third startup current value that is greater than the second current value(because the resistance is decreased by the resistance of R1). Similarly, when input is received at node 77, the gate of PMOS device 635 is shorted such that only resistor R5 is included in the current mirror. Thus, the current mirror will self bias up to a fourth startup current value that is greater than the third startup current value (because the resistance is decreased by the resistance of R3 and R4).

In the present embodiment, using a voltage of 3.3 Volts, the first startup current value is 2.0 microamps, the second startup current value is 2.5 microamps, the third startup current value is 3.0 microamps, and the fourth startup current value is 3.5 microamps. However, the present invention is well adapted for the use of different voltage levels and different resistors for obtaining different startup current values.

Control module 40 and Bias module 60 are operable to provide effective start-up of circuit 10. In the embodiment shown in FIG. 4, control module 40 is operable in response. to receiving input voltage at node 41 (ENABLE) to effectively start-up circuit 10 and initiate oscillation of external crystal 20. More particularly, upon receiving input voltage at node 41 (ENABLE), start logic module 402 couples a corresponding voltage to node 47(EN) or to node 48(ENB) for providing an enable signal to switches 11–12, to amplifier module 30, to bias module 60, to NOR device 95, and to output module 70. In addition, voltage is applied to either node 49(START) or to node 50(STARTB).

Figure 5:
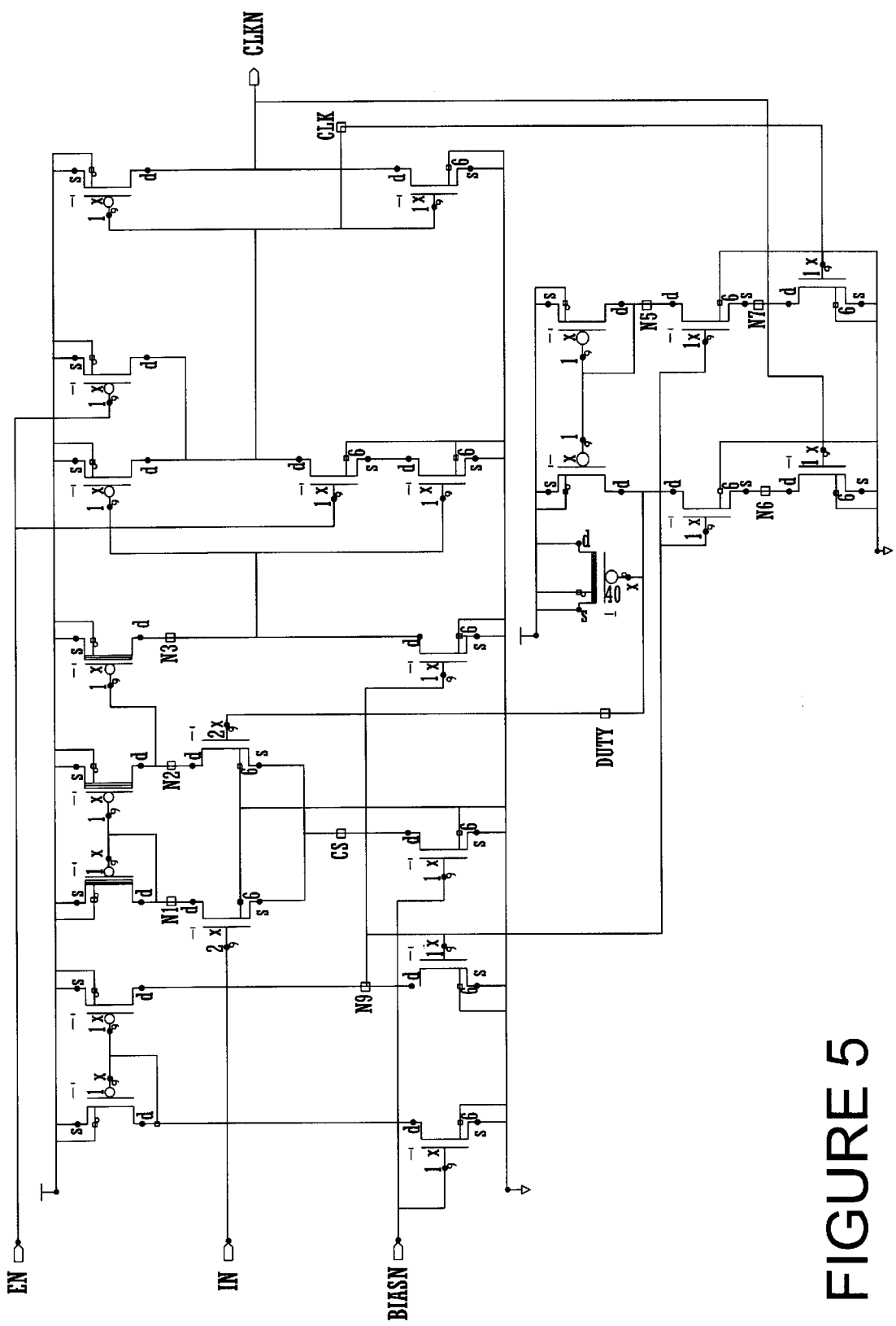
FIG. 5 shows an output module in accordance with one embodiment of the present invention.

Referring now to FIG. 5, bias module 60 is operable, upon receiving input from control module 40 to assure that circuit 10 will start up. More particularly, in the present embodiment, input is received at node 69(START) or node 70(STARTB) in the form of a finite pulse that is a several nanoseconds in length is operable to short node 660 to the output node 63(BIASN) to assure startup of circuit 10. More particularly, if node 660 were to start at supply voltage, and if node 63 were to start at ground, the circuit would not start up. Therefore, by shorting node 660 to node 63(BIASN), startup is assured.

Circuit 10 is programmable for controlling the capacitance level of the circuit. More particularly, in the present embodiment, control module 40 is programmable for providing input to bias module 60 for controlling the capacitance of circuit 10. In the present embodiment, control module 40 is programmable for obtaining two different levels of capacitance. However, the present invention is well adapted for embodiments that include fewer or more levels of capacitance, fewer or more capacitors and/or capacitors having different capacitance.

In the embodiment shown in FIG. 4, the input received at control module 40 indicates which of several capacitance levels are to be used. In the present embodiment capacitance is controlled by selectively providing output to one of nodes 51–54. More particularly, in the present embodiment, input via busses 45–46, node 42(RESET), node 43(IOW), and node 44(IOX) indicates one of four levels of capacitance. D-flip-flops 405–408 are operable in conjunction with inverters 411, 412 and 415 for decoding the received input so as to generate output that is coupled to nodes 51–54. In the present embodiment, output voltage drives node 51(C1) or node 52(C1B) for obtaining a first level of capacitance. Similarly, output current is coupled to node 53(C2) or node 54(C2B) for obtaining a second level of capacitance. The third and fourth levels of capacitance are combinations of the first two levels of capacitance.

Referring now to FIG. 3, bias module 60 is operable, upon receiving input from control module 40 to control the capacitance of circuit 10. More particularly, capacitors 605 and 606 form a capacitive divider that controls the amount of signal amplitude coupled to node 628. As the capacitor levels vary the amount of coupling is changed, influencing the bias level. In the present embodiment, PMOS devices 601–602 are operable in conjunction with capacitor 605 to provide a first level of capacitance when voltage drives node 71(C1) or node 72(C1B). In the present embodiment, capacitor 605 has a capacitance of approximately 390 femtofarads. PMOS devices 603–604 are operable in conjunction with capacitor 606 to provide a second level of capacitance when input current is received via node 73(C2) or node 74(C2B). In the present embodiment, capacitor 606 has a capacitance of 1170 femtofarads.

Referring back to FIG. 1, feedback is provided via line 62(AMPL) which is received as input to bias module 50. Bias module 50 generates output(BIASN) at node 63 which couples to amplifier module 30 and to output module 70. Output module 70 is operable in conjunction with NOR gate 95 to convert signals received from oscillator 20 to a level suitable for conventional CMOS device clock signal levels.

Accordingly, the method and apparatus of the present invention provides an oscillator circuit that has low power consumption. More particularly, the oscillator circuit of the present invention will draw in the micro amp range or below. during steady state operations. In addition, the oscillator circuit of the present invention provides multiple different levels of startup current. In addition, the present invention allows for multiple levels of capacitance. Thus, the method and apparatus of the present invention allows for configuring the startup current and the capacitance according to the needs of the circuit's application.

While the present invention has been described in particular embodiments, it should be appreciated that the present invention should not be construed as limited by such embodiments, but rather construed according to the below claims.

What is claimed is:

1. A crystal oscillator circuit including:
   a decoder for receiving programming indicating one of a plurality of different startup current levels; and
   a resistor chain, said decoder coupled to said resistor chain for controlling a resistance of said crystal oscillator circuit, said crystal oscillator circuit operable, upon receiving said programming, to generate said one of said plurality of different startup current levels.

2. The crystal oscillator circuit of claim 1 further including a plurality of flip-flops, said decoder and said flip-flops adapted to control the startup current level.

3. The crystal oscillator circuit of claim 2 further comprising:
   a first PMOS device, said first PMOS device coupled to said decoder and coupled to said resistor chain such that, upon activation of said first PMOS device, a current mirror is formed having a first resistivity;
   a second PMOS device, said second PMOS device coupled to said decoder and coupled to said resistor chain such that, upon activation of said second PMOS device, a current mirror is formed having a second resistivity; and
   a third PMOS device, said third PMOS device coupled to said decoder and coupled to said resistor chain such that, upon activation of said third PMOS device, a current mirror is formed having a third resistivity.

4. The crystal oscillator circuit of claim 3 wherein said resistor chain includes a first resistor and a second resistor, said first resistor disposed between a power source and said second resistor, said first PMOS device coupled to said resistor chain between said first resistor and said second resistor.

5. The crystal oscillator circuit of claim 4 wherein said resistor chain includes a third resistor that is coupled to said second resistor, said second PMOS device coupled to said resistor chain between said second resistor and said third resistor.

6. The crystal oscillator circuit of claim 5 wherein said first resistor has a resistance of approximately 0.423 k ohms, said second resistor has a resistance of approximately 0.634 k ohms, and said third resistor has a resistance of approximately 0.844 k ohms.

7. The crystal oscillator circuit of claim 1 wherein said circuit further includes provision for selecting one of a plurality of different levels of capacitance.

8. The crystal oscillator circuit of claim 7 further comprising a pass gate that includes circuitry for shorting a first node to a second node for assuring predetermined startup conditions are met.

9. The crystal oscillator circuit of claim 8 further comprising:
a crystal, said crystal oscillating in response to receiving an operating current comprising said one of said plurality of different startup current levels.

10. A microcontroller comprising:
a) provision for coupling an external crystal to said microcontroller;
b) a decoder for receiving programming indicating one of a plurality of different startup current levels; and
c) a crystal oscillator circuit coupled to said provision for coupling an external crystal to said microcontroller, said crystal oscillator circuit operable, upon receiving said programming, to generate said one of said plurality of different startup current levels.

11. The microcontroller of claim 10 wherein said circuit further includes:
c) provision for selecting one of a plurality of different levels of capacitance.

12. The microcontroller of claim 10 wherein said crystal oscillator circuit includes a resistor chain, said decoder coupled to said resistor chain for controlling a resistance of said crystal oscillator circuit.

13. The microcontroller of claim 12 further including a plurality of flip-flops, said decoder and said flip-flops adapted to control the startup current level in response to receiving said programming.

14. The microcontroller of claim 13 wherein said crystal oscillator circuit further comprises:
a first PMOS device, said first PMOS device coupled to said decoder and coupled to said resistor chain such that, upon activation of said first PMOS device, a current mirror is formed having a first resistivity;
a second PMOS device, said second PMOS device coupled to said decoder and coupled to said resistor chain such that, upon activation of said second PMOS device, a current mirror is formed having a second resistivity; and
a third PMOS device, said third PMOS device coupled to said decoder and coupled to said resistor chain such that, upon activation of said third PMOS device, a current mirror is formed having a third resistivity.

15. The microcontroller of claim 10 further comprising a pass gate that includes circuitry for shorting a first node to a second node for assuring predetermined startup conditions are met.

16. The microcontroller of claim 10 wherein said provision for coupling an external crystal to said microcontroller includes at least two contact pads, each of said at least two contact pads coupled to at least one switch for selectively disconnecting said at least two contact pads.

17. A microcontroller comprising:
a) a plurality of contact pads; and
b) a crystal oscillator circuit coupled to said plurality of contact pads, said crystal oscillator circuit including a decoder for receiving programming indicating one of a plurality of different startup current levels, said crystal oscillator circuit operable, upon receiving said programming, to generate said one of said plurality of different startup current levels.

18. The microcontroller of claim 17 wherein said crystal oscillator circuit further includes:
a plurality of flip-flops;
a resistor chain, said decoder coupled to said resistor chain for controlling a resistance of said crystal oscillator circuit, such that, upon receiving said programming, said crystal oscillator circuit generates said one of said plurality of different startup current levels; and
an amplifier coupled to said resistor chain so as to form a feedback loop.

19. The microcontroller of claim 18 wherein said crystal oscillator circuit further comprises:
a first PMOS device, said first PMOS device coupled to said decoder and coupled to said resistor chain such that, upon activation of said first PMOS device, a current mirror is formed having a first resistivity;
a second PMOS device, said second PMOS device coupled to said decoder and coupled to said resistor chain such that, upon activation of said second PMOS device, a current mirror is formed having a second resistivity; and
a third PMOS device, said third PMOS device coupled to said decoder and coupled to said resistor chain such that, upon activation of said third PMOS device, a current mirror is formed having a third resistivity.

20. The microcontroller of claim 19 further comprising a pass gate that includes circuitry for shorting a first node to a second node for assuring predetermined startup conditions are met.

21. An oscillator circuit including:
a decoder for receiving programming indicating one of a plurality of different startup current levels;
a resistor chain, said decoder coupled to said resistor chain for controlling a resistance of said oscillator circuit, said oscillator circuit operable, upon receiving said programming, to generate said one of said plurality of different startup current levels;
a plurality of flip-flops, said decoder and said flip-flops adapted to control the startup current level; and
provision for selecting one of a plurality of different levels of capacitance.

22. The oscillator circuit as described in claim 21 further comprising:
a first PMOS device, said first PMOS device coupled to said decoder and coupled to said resistor chain such that, upon activation of said first PMOS device, a current mirror is formed having a first resistivity;

a second PMOS device, said second PMOS device coupled to said decoder and coupled to said resistor chain such that, upon activation of said second PMOS device, a current mirror is formed having a second resistivity; and a third PMOS device, said third PMOS device coupled to said decoder and coupled to said resistor chain such that, upon activation of said third PMOS device, a current mirror is formed having a third resistivity.

23. The oscillator circuit as described in claim 22 wherein said resistor chain includes a first resistor and a second resistor, said first resistor disposed between a main power source and said second resistor, said first PMOS device coupled to said resistor chain between said first resistor and said second resistor.

24. The oscillator circuit as described in claim 23 wherein said resistor chain further includes a third resistor that is coupled to said second resistor, said second PMOS device coupled to said resistor chain between said second resistor and said third resistor.

* * * * *